(12) United States Patent
Ueda et al.

(10) Patent No.: US 10,505,061 B2
(45) Date of Patent: Dec. 10, 2019

(54) WAVELENGTH-CONVERSION ENCAPSULANT COMPOSITION, WAVELENGTH-CONVERTED ENCAPSULANT LAYER, AND SOLAR CELL MODULE USING SAME

(71) Applicant: NITTO DENKO CORPORATION, Osaka (JP)

(72) Inventors: Masataka Ueda, Osaka (JP); Hisanari Onouchi, Osaka (JP); Tatsuya Kitahara, Osaka (JP)

(73) Assignee: NITTO DENKO CORPORATION, Ibaraki-shi, Osaka (JP)

( * ) Notice: Subject to any disclaimer, the term of this patent is extended or adjusted under 35 U.S.C. 154(b) by 339 days.

(21) Appl. No.: 15/033,448

(22) PCT Filed: Oct. 30, 2014

(86) PCT No.: PCT/JP2014/078898
§ 371 (c)(1),
(2) Date: Apr. 29, 2016

(87) PCT Pub. No.: WO2015/064690
PCT Pub. Date: May 7, 2015

(65) Prior Publication Data
US 2016/0254405 A1 Sep. 1, 2016

(30) Foreign Application Priority Data
Oct. 30, 2013 (JP) ................................. 2013-225316

(51) Int. Cl.
*H01L 31/055* (2014.01)
*H02S 40/22* (2014.01)
(Continued)

(52) U.S. Cl.
CPC .......... *H01L 31/055* (2013.01); *H01L 31/042* (2013.01); *H01L 31/0481* (2013.01);
(Continued)

(58) Field of Classification Search
CPC . H01L 31/055; H01L 31/042; H01L 31/0481; H02S 40/22
See application file for complete search history.

(56) References Cited

U.S. PATENT DOCUMENTS

| | | | |
|---|---|---|---|
| 2009/0151785 A1 | 6/2009 | Naum et al. | |
| 2013/0074929 A1 | 3/2013 | Shimoi et al. | |
| 2013/0221239 A1 | 8/2013 | Tsujiuchi | |

FOREIGN PATENT DOCUMENTS

| | | |
|---|---|---|
| FR | 2 989 222 | 10/2013 |
| JP | H 07-142752 A | 6/1995 |

(Continued)

OTHER PUBLICATIONS

Office Action dated Mar. 39, 3016, issued in corresponding JP Application No. 2014-221317.
(Continued)

*Primary Examiner* — Matthew T Martin
(74) *Attorney, Agent, or Firm* — Hauptman Ham, LLP (57) ABSTRACT

A wavelength-converting encapsulant composition is provided, which includes a first organic material capable of absorbing ultraviolet light and converting absorbed light to longer wavelength light; and a second organic material capable of absorbing light with a wavelength longer than that of the light absorbed by the first organic material and converting absorbed light to longer wavelength light, wherein the maximum emission wavelength $\lambda_{1em}$ of the first organic material and the maximum excitation wavelength $\lambda_{2ex}$ of the second organic material satisfy the relationship of formula (1): $\lambda_{1em} - 60 \leq \lambda_{2ex}$ (nm), and which has high dura-
(Continued)

bility, is advantageous in terms of cost and suitable for use on solar cells, and can improve the photoelectric conversion efficiency of solar cells by converting light in a wavelength region not contributable to power generation to light in another wavelength region contributable to power generation.

9 Claims, 4 Drawing Sheets (51) Int. Cl.
   *H01L 31/048* (2014.01)
   *H01L 31/042* (2014.01)
(52) U.S. Cl.
   CPC .............. *H02S 40/22* (2014.12); *Y02E 10/52* (2013.01); *Y02E 10/542* (2013.01)

(56) References Cited

FOREIGN PATENT DOCUMENTS

| JP | 2006-303033 A | 11/2006 |
|---|---|---|
| JP | 2010-263115 A | 11/2010 |
| JP | 2011-204810 | 10/2011 |
| JP | 2012-025870 | 2/2012 |
| JP | 2013-074167 A | 4/2013 |
| JP | 2013-157560 | 8/2013 |
| JP | 2013-199583 A | 10/2013 |
| JP | 2015-523920 | 8/2015 |
| WO | 2010/076791 | 7/2010 |
| WO | WO 2011/149028 A1 | 12/2011 |
| WO | WO 2012/134992 A2 | 10/2012 |
| WO | WO 2013/069785 A1 | 5/2013 |
| WO | 2013/171275 | 11/2013 |

OTHER PUBLICATIONS

Product Information Shukosei Keiko Toryo Lumogen, Light-Harvesting Fluorescent Dye, Plastic Additives Division, High-Function Product Head Office, BASF JP Ltd. Apr. 12, 2013.
International Search Report for PCT/JP2014/078898 dated Jan. 15, 2015.
Supplementary European Search Report dated May 4, 2017, which issued during prosecution of European Application No. 14858373.5.
Ahmed, et al. "Characterisation of Luminescent Down-Shifting Materials for the Enhancement of Solar Cell Efficiency" The 2013 World Congress on Advances in Nano, Biometrics, Robotics, and Energy Research (ANBRE13), Aug. 28, 2013, pp. 1041-1049.
International Preliminary Report on Patentability and Written Opinion in PCT Application No. PCT/JP2014/078898, dated May 12, 2016, 6 pages.
Notification of Reasons for Refusal dated Jul. 21, 2016, which issued during prosecution of Japanese Application No. 2014-221317.
Communication pursuant to Article 94(3) EPC dated Mar. 21, 2018, which issued during prosecution of European Application No. 14 858 373.5.

WAVELENGTH-CONVERSION ENCAPSULANT COMPOSITION, WAVELENGTH-CONVERTED ENCAPSULANT LAYER, AND SOLAR CELL MODULE USING SAME

TECHNICAL FIELD

The invention relates to a wavelength-converting encapsulant composition particularly suitable for use in solar cell applications. The invention also relates to a wavelength-converting encapsulant layer including the composition and to a solar cell module using the wavelength-converting encapsulant layer. More specifically, the invention relates to a solar cell module that can achieve higher power generation efficiency by converting light in a wavelength region not contributable to power generation to light in another wavelength region contributable to power generation, and also to a wavelength-converting encapsulant composition and a wavelength-converting encapsulant layer each for use in such a solar cell module.

BACKGROUND ART

The use of solar energy provides a promising alternative source of energy to conventional fossil fuels. In recent years, therefore, great attention has focused on the development of devices capable of converting solar energy to electricity, such as photovoltaic devices (also known as solar cells). Some different types of mature photovoltaic devices have been developed, some examples of which include silicon-based devices, III-V and II-VI PN junction devices, copper-indium-gallium-selenium (CICS) thin-film devices, organic sensitizer devices, organic thin-film devices, and cadmium sulfide/cadmium telluride (CdS/CdTe) thin-film devices. Publications show these devices in more detail (see, for example, Non-Patent Document 1). Unfortunately, there is still room to improve the photoelectric conversion efficiency of many of these devices. Problems being addressed by many researchers are to develop techniques for improving the efficiency.

In order to improve the conversion efficiency, a solar cell having a wavelength-converting function is studied, in which a certain wavelength of incident light (e.g., in the ultraviolet region) not contributable to photoelectric conversion is converted to a wavelength contributable to photoelectric conversion (see, for example, Patent Document 2). Such a study proposes a method of mixing a fluorescent material powder with a resin material to form a luminescent panel.

Wavelength-converting inorganic media for use in photovoltaic devices and solar cells have been disclosed so far, whereas there are few studies reported on the use of photoluminescent organic media to improve the efficiency of photovoltaic devices. In contrast to the use of inorganic media, the use of organic media is attracting attention because organic materials are typically more inexpensive and easier to use and therefore provide a more economical choice.

In addition, conventional wavelength-converting inorganic media have an insufficient degree of wavelength conversion (wavelength conversion efficiency or wavelength shift width between before and after conversion). For example, two or more wavelength-converting medium layers may be simply combined, or two or more wavelength-converting media may be simply mixed in a single layer. However, it has been found that in such a case, the wavelength-converting media themselves absorb even a wavelength that could otherwise be absorbed and used for photoelectric conversion by other wavelength-converting media or solar cells, due to their wavelength absorption properties, so that almost no improvement in photoelectric conversion efficiency can be obtained or even a negative effect such as a reduction in photoelectric conversion efficiency can be obtained.

In addition, some inorganic and organic fluorescent materials conventionally used are degraded and significantly reduced in wavelength-converting function when exposed to sunlight. Absorption and emission also need to be made at wavelengths suitable for the characteristics of solar cells, but it is difficult to provide optimal wavelengths.

PRIOR ART DOCUMENTS

Patent Documents

Patent Document 1: US 2009/0151785 A
Patent Document 2: JP-A-07-142752

SUMMARY OF THE INVENTION

Problems to be Solved by the Invention

In view of these circumstances, it is an object of the invention to provide a wavelength-converting encapsulant composition that has high durability, is advantageous in terms of cost and suitable for use on solar cells, and can improve the photoelectric conversion efficiency of solar cells by converting light in a wavelength region not contributable to power generation to light in another wavelength region contributable to power generation.

It is another object of the invention to provide a wavelength-converting encapsulant layer made from such a wavelength-converting encapsulant composition and to provide a solar cell module having such a wavelength-converting encapsulant layer.

Means for Solving the Problems

As a result of intensive studies to solve the problems, the inventors have accomplished the invention based on findings that the objects can be achieved by means of the wavelength-converting encapsulant composition and the wavelength-converting encapsulant layer shown below and the solar cell module shown below, produced with the composition or the layer.

The invention is directed to a wavelength-converting encapsulant composition including:

a first organic material capable of absorbing ultraviolet light and converting absorbed light to light with a wavelength longer than that of the absorbed light; and a second organic material capable of absorbing light with a wavelength longer than that of the light absorbed by the first organic material and converting absorbed light to light with a wavelength longer than that of the absorbed light, wherein the first organic material and the second organic material have a maximum emission wavelength $\lambda_{1em}$ and a maximum excitation wavelength $\lambda_{2ex}$, respectively, satisfying the relationship of formula (1): $\lambda_{1em} - 60 \leq \lambda_{2ex}$ (nm).

Using the wavelength-converting encapsulant composition of the invention, light in a short wavelength region, which used to be not contributable to power generation and lost, is effectively converted to longer wavelength light, which is contributable to power generation and thus utilized more effectively. In addition, the invention makes it possible to significantly improve photoelectric conversion efficiency, for example, in contract to the case where two or more wavelength-converting medium layers are simply combined or two or more wavelength-converting media are simply mixed in a single layer, which can cause other wavelength-converting media to absorb light in a short wavelength region, which is to be absorbed by cells, or cause other wavelength-converting media to absorb the wavelength obtained after the conversion. In the invention, the term "molar absorption coefficient," which is also described in the EXAMPLES section, refers to the molar absorption coefficient obtained upon exposure to light at the maximum absorption wavelength of the corresponding compound.

In the invention, the term "maximum emission wavelength" refers to the wavelength at which the amount of light emitted by the corresponding compound is maximum. In the invention, the term "maximum excitation wavelength" refers to the wavelength at which the amount of light absorbed by the corresponding compound is maximum among the wavelengths that contribute to the emission of light by the compound. More specifically, for example, the maximum emission wavelength $\lambda_{1em}$ refers to the wavelength at which the amount of light emitted by the first organic material is maximum. In the invention, the maximum excitation wavelength $\lambda_{2ex}$ refers to the wavelength at which the amount of light absorbed by the second organic material is maximum among the wavelengths that contribute to the emission of light by the second organic material.

It is conceivable that in the invention with the features described above, the light emitted by the first organic material (organic dye) is used to excite the second organic material (organic dye) and cause the second organic material (organic dye) to further emit light, so that ultraviolet light can be converted to visible light with a wavelength longer than that obtained when a single organic dye or material is used to convert ultraviolet light. In particular, the first and second organic materials absorb light and emit light (fluorescence or phosphorescence), respectively, in an organized way, so that the degree of wavelength conversion (wavelength conversion efficiency or wavelength shift between before and after conversion) can be improved, which would otherwise be insufficient when conventional wavelength-converting inorganic media are used.

Solar cells can photo-electrically convert sunlight with wavelengths only in a certain region. In addition, most solar cell encapsulants contain an ultraviolet absorbing agent for preventing their degradation. On the other hand, in the invention, a combination of organic dyes in a specific relationship can effectively utilize ultraviolet rays, which used to be not contributable to power generation. It has been found that if any of organic dyes used in combination absorb light even in a wavelength region that is to be absorbed for photoelectric conversion by solar cells, even a negative effect, specifically, a reduction in photoelectric conversion efficiency can be produced (a negative influence caused by the use of a combination). It is conceivable that such a negative effect can be prevented when as a feature of the invention, the wavelength band in which the second organic material (organic dye) absorbs visible light is controlled in such a way that the organic dye does not absorb light in the wavelength region to be converted photo-electrically.

In the wavelength-converting encapsulant composition of the invention, the maximum absorption wavelength $\lambda_{1abs}$ of the first organic material and the maximum excitation wavelength $\lambda_{2ex}$ of the second organic material preferably satisfy the relationship of formula (2): $\lambda_{2ex} - \lambda_{1abs} \geq 5$ (nm). The use of such organic materials makes it easy to further improve photoelectric conversion efficiency.

In the invention, the term "maximum absorption wavelength" refers to the wavelength at which the amount of light absorbed by the corresponding compound is maximum. More specifically, in the invention, the maximum absorption wavelength $\lambda_{1abs}$ refers to the wavelength at which the amount of light absorbed by the first organic material is maximum.

In the wavelength-converting encapsulant composition of the invention, the maximum excitation wavelength $\lambda_{2ex}$ of the second organic material is preferably 500 nm or less. The use of the second organic material with such a feature makes it easy to further improve photoelectric conversion efficiency.

In the wavelength-converting encapsulant composition of the invention, the first organic material preferably has a Stokes shift $\Delta\lambda_1$ of 50 nm or more. When the first organic material with such a feature is used, light in a wavelength region not contributable to power generation in conventional techniques can be easily converted (red-shifted) to light in another wavelength region contributable to power generation, which can make it easy to further improve photoelectric conversion efficiency. In the invention, the term "Stokes shift" refers to the difference between the maximum excitation wavelength and the maximum emission wavelength.

In the wavelength-converting encapsulant composition of the invention, the first organic material preferably has an emission quantum yield $\phi_1$ of 85% or more. The use of the first organic material with such a feature makes it possible to more reliably improve photoelectric conversion efficiency. In the invention, the term "emission quantum yield" refers to the ratio of the number of photons emitted (or released) to the number of photons absorbed upon exposure to light at the maximum excitation wavelength.

In the wavelength-converting encapsulant composition of the invention, the second organic material preferably has an emission quantum yield $\phi_2$ of 85% or more. The use of the second organic material with such a feature makes it possible to more reliably improve photoelectric conversion efficiency.

In the wavelength-converting encapsulant composition of the invention, the first organic material preferably has a maximum absorption wavelength $\lambda_{1abs}$ of 300 to 400 nm. Using the first organic material with such a feature, light in the ultraviolet region, which is difficult (or impossible) for conventional solar cells to use for photoelectric conversion, can be converted to longer wavelength light, which can make it easy to further improve photoelectric conversion efficiency.

In the wavelength-converting encapsulant composition of the invention, the second organic material preferably has a maximum excitation wavelength $\lambda_{2ex}$ of 330 to 500 nm. Using the second organic material with such a feature, visible light in a short wavelength region, which is difficult (or impossible) for conventional solar cells to use for photoelectric conversion, can be converted to longer wavelength light, which can make it easy to further improve photoelectric conversion efficiency. In the invention, the longer wavelength light obtained by the conversion by the first organic material is further converted (red-shifted) to much longer wavelength light, which makes it possible to further improve photoelectric conversion efficiency.

In the wavelength-converting encapsulant composition of the invention, the first organic material may include at least one selected from the group consisting of a perylene derivative, a benzoxazole derivative, a benzothiadiazole derivative, a benzotriazole derivative, and a fluorene derivative.

In the wavelength-converting encapsulant composition of the invention, the second organic material may include at least one selected from the group consisting of a perylene derivative, a benzoxazole derivative, a benzothiadiazole derivative, a benzotriazole derivative, and a fluorene derivative.

In particular, the wavelength-converting encapsulant composition of the invention, which has the wavelength converting properties described above, is preferably used in solar cell applications.

On the other hand, the invention is directed to a wavelength-converting encapsulant layer formed using the wavelength-converting encapsulant composition. The wavelength-converting encapsulant layer formed using the wavelength-converting encapsulant composition has preferable optical properties (such as high quantum yields). More specifically, the wavelength-converting encapsulant layer, which contains the first and second organic materials satisfying the relationship of formula (1) above, can effectively convert light in a short wavelength region, which used to be not contributable to power generation and lost, to longer wavelength light contributable to power generation, which can be more effectively utilized. In addition, the invention makes it possible to significantly improve photoelectric conversion efficiency, for example, in contract to the case where two or more wavelength-converting medium layers are simply combined or two or more wavelength-converting media are simply mixed in a single layer, which can cause other wavelength-converting media to absorb light in a short wavelength region, which is to be absorbed, or cause other wavelength-converting media to absorb the wavelength obtained after the conversion. In addition, the wavelength-converting encapsulant layer of the invention exerts its function through the process of receiving at least one photon with a first wavelength as an input and giving at least one photon with a second wavelength as an output, wherein the second wavelength is longer (larger) than the first wavelength. The wavelength-converting encapsulant layer is particularly suitable for use in solar cell applications.

The invention is also directed to a solar cell module including the wavelength-converting encapsulant layer formed using the wavelength-converting encapsulant composition. The solar cell module having the wavelength converting-encapsulant layer has preferable optical properties (such as high quantum yields).

In the solar cell module of the invention, the wavelength-converting encapsulant layer is preferably so disposed that incident light passes through the wavelength-converting encapsulant layer before reaching the solar cell. In this structure, a wider spectrum of solar energy can be more reliably converted to electricity, so that the photoelectric conversion efficiency can be effectively increased.

In the solar cell module of the invention, the solar cell is preferably a crystalline silicon solar cell, an amorphous silicon solar cell, a microcrystalline silicon solar cell, a thin-film silicon solar cell, a heterojunction solar cell, a multi-junction solar cell, a cadmium sulfide/cadmium telluride solar cell, a CIS thin-film solar cell, a CIGS thin-film solar cell, a CZTS thin-film solar cell, a group III-V solar cell, a dye-sensitized solar cell, or an organic semiconductor solar cell. The photoelectric conversion efficiency of the solar cell module can be more effectively improved by using a stack of solar cells of the above type. In particular, silicon solar cells have a problem in that their photoelectric conversion efficiency is low in the ultraviolet region. The solar cell module mentioned above can also more effectively utilize light in this wavelength region.

MODE FOR CARRYING OUT THE INVENTION

Hereinafter embodiments of the invention will be described.

The wavelength-converting encapsulant composition of the invention includes a first organic material capable of absorbing ultraviolet light and converting absorbed light to light with a wavelength longer than that of the absorbed light and a second organic material capable of absorbing light with a wavelength longer than that of the light absorbed by the first organic material and converting absorbed light to light with a wavelength longer than that of the absorbed light, wherein the first organic material and the second organic material have a maximum emission wavelength $\lambda_{1em}$ and a maximum excitation wavelength $\lambda_{2ex}$ respectively, satisfying the relationship of formula (1): $\lambda_{1em} - 60 \leq \lambda_{2ex}$ (nm).

(Wavelength-Converting Encapsulant Composition)

The wavelength-converting encapsulant composition of the invention includes a first organic material capable of absorbing ultraviolet light and converting absorbed light to light with a wavelength longer than that of the absorbed light and a second organic material capable of absorbing light with a wavelength longer than that of the light absorbed by the first organic material and converting absorbed light to light with a wavelength longer than that of the absorbed light.

In the invention, the first organic material is capable of absorbing ultraviolet light and converting absorbed light to light with a wavelength longer than that of the absorbed light. In other words, the first organic material is capable of receiving at least one photon with a first wavelength as an input and giving at least one photon with a second wavelength as an output, wherein the second wavelength is longer (larger) than the first wavelength. The term "organic material" is intended to include not only organic compounds but also organometallic complexes, organic-inorganic hybrid materials, dye moiety-containing oligomer compounds, and dye moisty-containing polymer compounds.

In the invention, the first organic material preferably has a Stokes shift $\Delta\lambda_1$ of 50 nm or more. The Stokes shift may be from 50 to 100 nm or from 50 to 70 nm.

In the invention, the first organic material preferably has an emission quantum yield $\phi_1$ of 85% or more, more preferably 90% or more, even more preferably 93% or more.

In the invention, the first organic material preferably has a maximum absorption wavelength $\lambda_{1abs}$ of 300 to 400 nm. The maximum absorption wavelength $\lambda_{1abs}$ may be from 300 to 360 nm or from 330 to 350 nm.

In the invention, the first organic material preferably has a maximum emission wavelength $\lambda_{1em}$ of 350 to 450 nm. The maximum emission wavelength $\lambda_{1em}$ may be from 380 to 440 nm or from 400 to 420 nm. The use of the first organic material makes it possible to further improve photoelectric conversion efficiency.

The first organic material may be an organic fluorescent compound. A known organic dye compound (such as an organic dye or an organic fluorescent dye) may be used as the organic fluorescent compound. Examples of the organic fluorescent compound include perylene derivatives, pyrene derivatives, benzoxazole derivatives, benzothiazole derivatives, benzothiadiazole derivatives, benzotriazole derivatives, benzimidazole derivatives, benzimidazoline derivatives, benzopyrazole derivatives, indole derivatives, isoindole derivatives, purine derivatives, pyrimidine derivatives, pyrazine derivatives, triazine derivatives, aromatic imide derivatives, benzoxazoyl derivatives, coumarin derivatives, styrene biphenyl derivatives, pyrazolone derivatives, bis(triazinylamino)stilbenedisulfonic acid derivatives, bis(styryl)biphenyl derivatives, bis(benzoxazolyl)thiophene derivatives, pentacene derivatives, fluorescein derivatives, rhodamine derivatives, acridine derivatives, flavone derivatives, fluorene derivatives, cyanine dyes, rhodamine dyes, and polycyclic aromatic hydrocarbons. In particular, the first organic material preferably includes at least one selected from the group consisting of a perylene derivative, a benzoxazole derivative, a benzothiadiazole derivative, a benzotriazole derivative, and a fluorene derivative.

More specifically, examples of the organic fluorescent compound include naphthalimide, perylene, anthraquinone, coumarin, benzocoumarin, xanthene, phenoxazine, benzo[a]phenoxazine, benzo[b]phenoxazine, benzo[c]phenoxazine, naphthalimide, naphtholactam, azlactone, methine, oxazine, triazine, diketopyrrolopyrrole, quinacridone, benzoxanthene, thioepindoline, lactamimide, diphenylmaleimide, acetoacetamide, imidazothiazine, benzanthrone, perylene monoimide, phthalimide, benzotriazole, benzothiadiazole, benzoxazole, pyrimidine, pyrazine, triazole, dibenzofuran, triazine, and derivatives thereof, and barbituric acid derivatives. These compounds may be used alone or in a mixture of two or more.

The first organic material may also be an organometallic complex. For example, a known organic complex of a rare earth metal may be used as the organometallic complex. The organometallic complex may include a rare earth element as a central metal element, examples of which include, but are not limited to, scandium, yttrium, lanthanum, cerium, praseodymium, neodymium, samarium, europium, gadolinium, terbium, dysprosium, holmium, erbium, thulium, ytterbium, and lutetium. In particular, europium or samarium is preferred. Particularly in view of wavelength conversion efficiency, the organometallic complex is preferably at least one of a europium complex or a samarium complex.

The ligand used to form the organic complex is not limited and may be selected as appropriate depending on the metal used. In particular, the ligand is preferably capable of forming a complex with at least one of europium or samarium. The ligand is preferably at least one selected from a carboxylic acid, a nitrogen-containing organic compound, a nitrogen-containing aromatic heterocyclic compound, a β-diketone, and a phosphine oxide, which are neutral ligands.

Examples of the carboxylic acid include aliphatic carboxylic acids such as butyric acid, stearic acid, oleic acid, coconut oil fatty acid, tert-butylcarboxylic acid, and succinic acid; and aromatic carboxylic acids such as benzoic acid, naphthoic acid, and quinolinecarboxylic acid.

Examples of the nitrogen-containing organic compound include alkylamines, aromatic amines such as aniline, and nitrogen-containing aromatic heterocyclic compounds. Specifically, the nitrogen-containing organic compound may be, for example, 1,10-phenanthroline or bipyridyl. Examples that may be used also include imidazole, triazole, pyrimidine, pyrazine, aminopyridine, pyridine, and derivatives thereof, nucleic acid bases such as adenine, thymine, guanine, and cytosine, and derivatives thereof.

Examples of the β-diketone include 1,3-diphenyl-1,3-propanedione, acetylacetone, benzoylacetone, dibenzoylacetone diisobutylomethane, dipivaloylmethane, 3-methylpentane-2,4-dione, 2,2-dimethylpentane-3,5-dione, 2-methyl-1,3-butanedione, 1,3-butanedione, 3-phenyl-2,4-pentanedione, 1,1,1-trifluoro-2,4-pentanedione, 1,1,1-trifluoro-5,5-dimethyl-2,4-hexanedione, 2,2,6,6-tetramethyl-3,5-heptanedione, 3-methyl-2,4-pentanedione, 2-acetylcyclopentanone, 2-acetylcyclohexanone, 1-heptafluoropropyl-3-tert-butyl-1,3-propanedione, 1,3-diphenyl-2-methyl-1,3-propanedione (diphenylacetylacetone), and 1-ethoxy-1,3-butanedione. In particular, 1,3-diphenyl-1,3-propanedione, acetylacetone, and benzoylacetone are preferred.

The first organic material may also be any of a dye moiety-containing oligomer compound and a dye moiety-containing polymer compound. The oligomer and polymer compounds may be those having a known organic dye compound structure (such an organic dye structure or an organic fluorescent dye structure) as a dye moiety in their molecule. The oligomer and polymer compounds may be, for example, oligomer and polymer compounds having, as a dye moiety in their molecule, one molecular structure selected from the group consisting of a perylene derivative, a pyrene derivative, a benzoxazole derivative, a benzothiazole derivative, a benzothiadiazole derivative, a benzotriazole derivative, a benzimidazole derivative, a benzimidazoline derivative, a benzopyrazole derivative, an indole derivative, an isoindole derivative, a purine derivative, a pyrimidine derivative, a pyrazine derivative, a triazine derivative, an aromatic imide derivative, a benzoxazoyl derivative, a coumarin derivative, a styrene biphenyl derivative, a pyrazolone derivative, a bis(triazinylamino)stilbenedisulfonic acid derivative, a bis(styryl)biphenyl derivative, a bis(benzoxazolyl)thiophene derivative, a pentacene derivative, a fluorescein derivative, a rhodamine derivative, an acridine derivative, a flavone derivative, a fluorene derivative, a cyanine dye, a rhodamine dye, and a polycyclic aromatic hydrocarbon. In particular, the first organic material is preferably an oligomer or polymer compound having, as a dye moiety in the molecule, one molecular structure selected from the group consisting of a perylene derivative, a benzoxazole derivative, a benzothiadiazole derivative, a benzotriazole derivative, and a fluorene derivative. These molecular structures may be used alone or in combination of two or more to form a single oligomer or polymer compound. The oligomer compounds and the polymer compounds shown above may be used alone or in a mixture of two or more.

The oligomer and polymer compounds preferably have an optically transparent resin skeleton as a main chain structure. Examples of the main chain structure include polyethylene terephthalate, poly(meth)acrylate, polyvinyl acetate, polyolefins such as polyethylenetetrafluoroethylene, polyimide, amorphous polycarbonate, siloxane sol-gel, polyurethane, polystyrene, polyether sulfone, polyarylate, epoxy resins, and silicone resins. These main chain structures may be used alone or in combination of two or more.

The content of the first organic material is preferably from 0.001 to 0.5 parts by weight and may be from 0.001 to 0.3 parts by weight or from 0.005 to 0.2 parts by weight based on 100 parts by weight of the matrix resin in the wavelength-converting encapsulant composition.

In the invention, the second organic material is capable of absorbing ultraviolet light and converting absorbed light to light with a wavelength longer than that of the absorbed light. In other words, the second organic material is capable of receiving at least one photon with a first wavelength as an input and giving at least one photon with a second wavelength as an output, wherein the second wavelength is longer (larger) than the first wavelength. The term "organic material" is intended to include not only organic compounds but also organometallic complexes, organic-inorganic hybrid materials, dye moiety-containing oligomer compounds, and dye moisty-containing polymer compounds.

In the invention, the second organic material preferably has a Stokes shift $\Delta\lambda_2$ of 50 nm or more. The Stokes shift may be from 50 to 100 nm or from 50 to 70 nm.

In the invention, the second organic material preferably has an emission quantum yield $\phi_2$ of 85% or more, more preferably 90% or more, even more preferably 93% or more.

In the invention, the second organic material preferably has a maximum excitation wavelength $\lambda_{2ex}$ of 330 to 500 nm. The maximum excitation wavelength $\lambda_{2ex}$ may be from 340 to 450 nm.

In the invention, the second organic material preferably has a maximum emission wavelength $\lambda_{2em}$ of 400 to 550 nm. The maximum emission wavelength $\lambda_{2em}$ may be from 910 to 530 nm. The use of the second organic material makes it possible to further improve photoelectric conversion efficiency.

The second organic material may be an organic fluorescent compound. A known organic dye compound (such as an organic dye or an organic fluorescent dye) may be used as the organic fluorescent compound. Examples of the organic fluorescent compound include perylene derivatives, pyrene derivatives, benzoxazole derivatives, benzothiazole derivatives, benzothiadiazole derivatives, benzotriazole derivatives, benzimidazole derivatives, benzimidazoline derivatives, benzopyrazole derivatives, indole derivatives, isoindole derivatives, purine derivatives, pyrimidine derivatives, pyrazine derivatives, triazine derivatives, aromatic imide derivatives, benzoxazoyl derivatives, coumarin derivatives, styrene biphenyl derivatives, pyrazolone derivatives, bis(triazinylamino)stilbenedisulfonic acid derivatives, bis(styryl)biphenyl derivatives, bis(benzoxazolyl)thiophene derivatives, pentacene derivatives, fluorescein derivatives, rhodamine derivatives, acridine derivatives, flavone derivatives, fluorene derivatives, cyanine dyes, rhodamine dyes, and polycyclic aromatic hydrocarbons. In particular, the second organic material preferably includes at least one selected from the group consisting of a perylene derivative, a benzoxazole derivative, a benzothiadiazole derivative, a benzotriazole derivative, and a fluorene derivative.

More specifically, examples of the organic fluorescent compound include naphthalimide, perylene, anthraquinone, coumarin, benzocoumarin, xanthene, phenoxazine, benzo[a]phenoxazine, benzo[b]phenoxazine, benzo[c]phenoxazine, naphthalimide, naphtholactam, azlactone, methine, oxazine, thiazine, diketopyrrolopyrrole, quinacridone, benzoxanthene, thioepindoline, lactamimide, diphenylmaleimide, acetoacetamide, imidazothiazine, benzanthrone, perylene monoimide, phthalimide, benzotriazole, benzothiadiazole, benzoxazole, pyrimidine, pyrazine, triazole, dibenzofuran, triazine, and derivatives thereof, and barbituric acid derivatives. These compounds may be used alone or in a mixture of two or more.

The second organic material may also be an organometallic complex. For example, a known organic complex of a rare earth metal may be used as the organometallic complex. The organometallic complex may include a rare earth element as a central metal element, examples of which include, but are not limited to, scandium, yttrium, lanthanum, cerium, praseodymium, neodymium, samarium, europium, gadolinium, terbium, dysprosium, holmium, erbium, thulium, ytterbium, and lutetium. In particular, europium or samarium is preferred. Particularly in view of wavelength conversion efficiency, the organometallic complex is preferably at least one of a europium complex or a samarium complex.

The ligand used to form the organic complex is not limited and may be selected as appropriate depending on the metal used. In particular, the ligand is preferably capable of forming a complex with at least one of europium or samarium. The ligand is preferably at least one selected from a carboxylic acid, a nitrogen-containing organic compound, a nitrogen-containing aromatic heterocyclic compound, a β-diketone, and a phosphine oxide, which are neutral ligands.

Examples of the carboxylic acid include aliphatic carboxylic acids such as butyric acid, stearic acid, oleic acid, coconut oil fatty acid, tert-butylcarboxylic acid, and succinic acid; and aromatic carboxylic acids such as benzoic acid, naphthoic acid, and quinolinecarboxylic acid.

Examples of the nitrogen-containing organic compound include alkylamines, aromatic amines such as aniline, and nitrogen-containing aromatic heterocyclic compounds. Specifically, the nitrogen-containing organic compound may be, for example, 1,10-phenanthroline or bipyridyl. Examples that may be used also include imidazole, triazole, pyrimidine, pyrazine, aminopyridine, pyridine, and derivatives thereof, nucleic acid bases such as adenine, thymine, guanine, and cytosine, and derivatives thereof.

Examples of the β-diketone include 1,3-diphenyl-1,3-propanedione, acetylacetone, benzoylacetone, dibenzoylacetone diisobutylomethane, dipivaloylmethane, 3-methylpentane-2,4-dione, 2,2-dimethylpentane-3,5-dione, 2-methyl-1,3-butanedione, 1,3-butanedione, 3-phenyl-2,4-pentanedione, 1,1,1-trifluoro-2,4-pentanedione, 1,1,1-trifluoro-5,5-dimethyl-2,4-hexanedione, 2,2,6,6-tetramethyl-3,5-heptanedione, 3-methyl-2,4-pentanedione, 2-acetylcyclopentanone, 2-acetylcyclohexanone, 1-heptafluoropropyl-3-tert-butyl-1,3-propanedione, 1,3-diphenyl-2-methyl-1,3-propanedione (diphenylacetylacetone), and 1-ethoxy-1,3-butanedione. In particular, 1,3-diphenyl-1,3-propanedione, acetylacetone, and benzoylacetone are preferred.

The second organic material may also be any of a dye moiety-containing oligomer compound and a dye moiety-containing polymer compound. The oligomer and polymer compounds may be those having a known organic dye compound structure (such an organic dye structure or an organic fluorescent dye structure) as a dye moiety in their molecule. The oligomer and polymer compounds may be, for example, oligomer and polymer compounds having, as a dye moiety in their molecule, one molecular structure selected from the group consisting of a perylene derivative, a pyrene derivative, a benzoxazole derivative, a benzothiazole derivative, a benzothiadiazole derivative, a benzotriazole derivative, a benzimidazole derivative, a benzimidazoline derivative, a benzopyrazole derivative, an indole derivative, an isoindole derivative, a purine derivative, a pyrimidine derivative, a pyrazine derivative, a triazine derivative, an aromatic imide derivative, a benzoxazoyl derivative, a coumarin derivative, a styrene biphenyl derivative, a pyrazolone derivative, a bis(triazinylamino)stilbenedisulfonic acid derivative, a bis(styryl)biphenyl derivative, a bis(benzoxazolyl)thiophene derivative, a pentacene derivative, a fluorescein derivative, a rhodamine derivative, an acridine derivative, a flavone derivative, a fluorene derivative, a cyanine dye, a rhodamine dye, and a polycyclic aromatic hydrocarbon. In particular, the first organic material is preferably an oligomer or polymer compound having, as a dye moiety in the molecule, one molecular structure selected from the group consisting of a perylene derivative, a benzoxazole derivative, a benzothiadiazole derivative, a benzotriazole derivative, and a fluorene derivative. These molecular structures may be used alone or in combination of two or more to form a single oligomer or polymer compound. The oligomer compounds and the polymer compounds shown above may be used alone or in combination of two or more.

The oligomer and polymer compounds preferably have an optically transparent resin skeleton as a main chain structure. Examples of the main chain structure include polyethylene terephthalate, poly(meth)acrylate, polyvinyl acetate, polyolefins such as polyethylenetetrafluoroethylene, polyimide, amorphous polycarbonate, siloxane sol-gel, polyurethane, polystyrene, polyether sulfone, polyarylate, epoxy resins, and silicone resins. These main chain structures may be used alone or in combination of two or more.

The content of the second organic material is preferably from 0.0001 to 0.1 parts by weight and may be from 0.0001 to 0.05 parts by weight or from 0.001 to 0.02 parts by weight based on 100 parts by weight of the matrix resin in the wavelength-converting encapsulant composition.

The wavelength-converting encapsulant composition of the invention has a wavelength-converting function. The wavelength-converting encapsulant composition functions to convert the wavelength of incident light to a wavelength longer than that of the incident light. The wavelength-converting encapsulant composition can be formed by dispersing the first and second organic materials having a wavelength-converting function and optional materials in an optically transparent matrix resin.

An optically transparent matrix resin is preferably used to form the wavelength-converting encapsulant composition of the invention. Examples of the matrix resin include polyethylene terephthalate, poly(meth)acrylate, polyvinyl acetate, polyolefins such as polyethylenetetrafluoroethylene, polyimide, amorphous polycarbonate, siloxane sol-gel, polyurethane, polystyrene, polyether sulfone, polyarylate, epoxy resins, and silicone resins. These matrix resins may be used alone or in a mixture of two or more.

The term "poly(meth)acrylate" is intended to include polyacrylate and polymethacrylate, examples of which include (meth)acrylate resins. Examples of polyolefin resins include polyethylene, polypropylene, and polybutadiene. Examples of polyvinyl acetate include polyvinyl formal, polyvinyl butyral (PVB resins), and modified PVB.

Examples of monomers used to form the (meth)acrylate resins include alkyl (meth)acrylates such as methyl acrylate, methyl methacrylate, ethyl acrylate, ethyl methacrylate, butyl acrylate, butyl methacrylate, 2-ethylhexyl acrylate, and 2-ethylhexyl methacrylate, and cyclohexyl acrylate, cyclohexyl methacrylate, phenyl acrylate, phenyl methacrylate, benzyl acrylate, and benzyl methacrylate. Examples also include monomers derived from alkyl (meth)acrylates by substituting the alkyl group with a hydroxyl group, an epoxy group, a halogen group, or any other group. These compounds may be used alone or in a mixture of two or more.

The ester moiety of the (meth)acrylate preferably has an alkyl group of 1 to 18 carbon atoms, more preferably an alkyl group of 1 to 8 carbon atoms.

The (meth)acrylate resin may be a copolymer of the (meth)acrylate and an unsaturated monomer copolymerizable therewith.

Examples of the unsaturated monomer include unsaturated organic acids such as methacrylic acid and acrylic acid, styrene, α-methylstyrene, acrylamide, diacetone acrylamide, acrylonitrile, methacrylonitrile, maleic anhydride, phenylmaleimide, and cyclohexylmaleimide. These unsaturated monomers may be used alone or in a mixture of two or more.

In particular, examples of the (meth)acrylate that are preferably used include methyl acrylate, ethyl acrylate, isobutyl acrylate, n-butyl acrylate, 2-ethylhexyl acrylate, methyl methacrylate, isobutyl methacrylate, n-butyl methacrylate, 2-ethylhexyl methacrylate, and functional group-substituted alkyl (meth)acrylates. In view of durability and versatility, methyl methacrylate is a more preferred example.

Examples of the copolymer of the (meth)acrylate and the unsaturated monomer include (meth)acrylate-styrene copolymers and ethylene-vinyl acetate copolymers. Particularly in view of moisture resistance, versatility, and costs, ethylene-vinyl acetate copolymers are preferred. In view of durability and surface hardness, (meth)acrylate polymers are preferred. From these points of view, a combination of an ethylene-vinyl acetate copolymer and a (meth)acrylate polymer is preferred.

The content of the vinyl acetate monomer unit in the ethylene-vinyl acetate copolymer is preferably from 10 to 35 parts by weight, more preferably from 20 to 30 parts by weight, based on 100 parts by weight of the ethylene-vinyl acetate copolymer. The content in these ranges is advantageous for uniform dispersibility of the rare earth complex and other components in the matrix resin.

Any of appropriate commercially available products of the ethylene-vinyl acetate copolymer may be used as the optically transparent matrix resin. Examples of commercially available products of the ethylene-vinyl acetate copolymer include Ultrathene (manufactured by Tosoh Corporation), EVAFLEX (manufactured by DUPONT-MITSUI POLYCHEMICALS CO., LTD), Suntec EVA (manufactured by Asahi Kasei Chemicals Corporation), UBE EVA Copolymer (manufactured by UBE-MARUZEN POLYETHYLENE), EVATATE (manufactured by Sumitomo Chemical Company, Limited), Novatec EVA (manufactured by Japan Polyethylene Corporation), SUMITATE (manufactured by Sumitomo Chemical Company, Limited), and Nipoflex (manufactured by Tosoh Corporation).

The matrix resin may have a crosslinked structure formed by adding a crosslinking monomer.

Examples of the crosslinking monomer include dicyclopentenyl (meth)acrylate, tetrahydrofurfuryl (meth)acrylate, benzyl (meth)acrylate, compounds obtained by reaction of polyhydric alcohols with α,β-unsaturated carboxylic acids (such as polyethylene glycol di(meth)acrylate (with 2 to 14 ethylene groups), trimethylolpropane di(meth)acrylate, trimethylolpropane tri(meth)acrylate, trimethylolpropane ethoxytri(meth)acrylate, trimethylolpropane propoxytri (meth)acrylate, tetramethylolmethane tri(meth)acrylate, tetramethylolmethane tetra(meth)acrylate, polypropylene glycol di(meth)acrylate (with 2 to 14 propylene groups), dipentaerythritol penta(meth)acrylate, dipentaerythritol hexa(meth)acrylate, bisphenol A polyoxyethylene di(meth)acrylate, bisphenol A dioxyethylene di(meth)acrylate, bisphenol A trioxyethylene di(meth)acrylate, and bisphenol A decaoxyethylene di(meth)acrylate), compounds obtained by addition reaction of α,β-unsaturated carboxylic acids with glycidyl group-containing compounds (such as trimethylolpropane triglycidyl ether triacrylate and bisphenol A diglycidyl ether diacrylate), esters between polycarboxylic acids (such as phthalic anhydride) and compounds having hydroxyl and ethylenic unsaturated groups (such as β-hydroxyethyl (meth)acrylate), alkyl acrylates or alkyl methacrylates (such as methyl (meth)acrylate, ethyl (meth)acrylate, butyl (meth)acrylate, and 2-ethylhexyl (meth)acrylate), and urethane (meth)acrylates (such as a product of reaction of tolylene diisocyanate and 2-hydroxyethyl (meth)acrylate and a product of reaction of trimethylhexamethylene diisocyanate, cyclohexane dimethanol, and 2-hydroxyethyl (meth)acrylate). These crosslinking monomers may be used alone or in a mixture of two or more. In particular, the crosslinking monomer is preferably trimethylolpropane tri (meth)acrylate, dipentaerythritol tetra(meth)acrylate, dipentaerythritol hexa(meth)acrylate, or bisphenol A polyoxyethylene dimethacrylate.

When the crosslinking monomer is used to form the matrix resin, the crosslinking monomer may be mixed with a thermal polymerization initiator or a photopolymerization initiator and then subjected to polymerization and crosslinking by heating or exposure to light to form a crosslinked structure.

The thermal polymerization initiator may be a known appropriate peroxide. Examples of the thermoplastic resin polymerization initiator include 2,5-dimethylhexane-2,5-dihydroperoxide, 2,5-dimethyl-2,5-di(tert-butylperoxy) hexane-3, di-tert-butyl peroxide, dicumyl peroxide, 2,5-dimethyl-2,5-di(tert-butylperoxy)hexane, dicumyl peroxide, α,α'-bis(tert-butylperoxyisopropyl)benzene, n-butyl-4,4-bis (tert-butylperoxy)butane, 2,2-bis(tert-butylperoxy)butane, 1,1-bis(tert-butylperoxy)cyclohexane, 1,1-bis(tert-butylperoxy)-3,3,5-trimethylcyclohexane, tert-butylperoxybenzoate, and benzoyl peroxide. These compounds may be used alone or in a mixture of two or more.

The thermal polymerization initiator may be used in an amount of, for example, 0.1 to 5 parts by weight based on 100 parts by weight of the matrix resin.

The photopolymerization initiator may be a known appropriate photoinitiator capable of producing a free radical upon exposure to ultraviolet or visible light. Examples of the photopolymerization initiator include benzoin ethers such as benzoin methyl ether, benzoin ethyl ether, benzoin propyl ether, benzoin isobutyl ether, and benzoin phenyl ether; benzophenones such as benzophenone, N,N'-tetramethyl-4, 4'-diaminobenzophenone (Michler's ketone), and N,N'-tetraethyl-4,4'-diaminobenzophenone; benzyl ketals such as benzyl dimethyl ketal (IRGACURE 651 manufactured by Ciba Specialty Chemicals, Japan) and benzyl diethyl ketal; acetophenones such as 2,2-dimethoxy-2-phenylacetophenone, p-tert-butyldichloroacetophenone, and p-dimethylaminoacetophenone; xanthones such as 2,4-dimethylthioxanthone and 2,4-diisopropylthioxanthone; hydroxycyclohexyl phenyl ketone (IRGACURE 184 manufactured by Ciba Specialty Chemicals); 1-(4-isopropylphenyl)-2-hydroxy-2-methylpropan-1-one (DAROCUR 1116 manufacturedby Ciba Specialty Chemicals, Japan); and 2-hydroxy-2-methyl-1-phenylpropan-1-one (DAROCUR 1173 manufactured by Merck KGaA). These may be used alone or in a mixture of two or more.

The photopolymerization initiator may also be a combination of a 2,4,5-triarylimidazole dimer and 2-mercaptobenzoxazole, leuco crystal violet, or tris(4-diethylamino-2-methylphenyl)methane. Any known appropriate additive such as a tertiary amine (e.g., triethanolamine for benzophenone) may also be used.

The photopolymerization initiator may be used in an amount of, for example, 0.1 to 5 parts by weight based on 100 parts by weight of the matrix resin.

The matrix resin may have a refractive index, for example, in the range of 1.4 to 1.7, in the range of 1.45 to 1.65, or in the range of 1.45 to 1.55. In some embodiments, the polymer matrix resin has a refractive index of 1.5.

The wavelength-converting encapsulant composition can be formed, for example, by dispersing or adsorbing the first and second organic materials with a wavelength-converting function in or to the matrix resin or by impregnating the matrix resin with the first and second organic materials with a wavelength-converting function.

The wavelength-converting encapsulant composition has the feature that the maximum emission wavelength $\lambda_{1em}$ of the first organic material and the maximum excitation wavelength $\lambda_{2ex}$ of the second organic material satisfy the relationship of formula (1): $\lambda_{1em}-60 \leq \lambda_{2ex}$ (nm). The maximum emission wavelength $\lambda_{1em}$ and the maximum excitation wavelength $\lambda_{2ex}$ may satisfy $\lambda_{1em}-55 \leq \lambda_{2ex}$ (nm), $\lambda_{1em}-50 \leq \lambda_{2ex}$ (nm), $\lambda_{1em}-20 \leq \lambda_{2ex}$ (nm) $\lambda_{1em}-15 \leq \lambda_{2ex}$ (nm) $\lambda_{1em}-10 \leq \lambda_{2ex}$ (nm), or $\lambda_{1em}-0 \leq \lambda_{2ex}$ (nm). It is conceivable that in the wavelength-converting encapsulant composition of the invention satisfying the relationship, the light emitted by the first organic material at a wavelength shifted to a longer wavelength region can be effectively used to excite the second compound and then to allow the second organic material to emit light at a wavelength shifted (red-shifted) to a longer wavelength region, so that light in a wavelength region not contributable to power generation can be converted to light in a wavelength region contributable to power generation.

$\lambda_{1em}-60 \leq \lambda_{2ex}$(nm). Formula (1)

The wavelength-converting encapsulant composition may have the feature that the maximum absorption wavelength $\lambda_{1abs}$ of the first organic material and the maximum excitation wavelength $\lambda_{2ex}$ of the second organic material satisfy the relationship of formula (2): $\lambda_{2ex}-\lambda_{1abs} \geq 5$ (nm). The maximum absorption wavelength $\lambda_{1abs}$ and the maximum excitation wavelength $\lambda_{2ex}$ may satisfy $\lambda_{2ex}-\lambda_{1abs} \geq 10$ (nm), $\lambda_{2ex}-\lambda_{1abs} \geq 50$ (nm), $\lambda_{2ex}-\lambda_{1abs} \geq 60$ (nm), $\lambda_{2ex}-\lambda_{1abs} \geq 70$ (nm), or $\lambda_{2ex}-\lambda_{1abs} \geq 80$ (nm).

It is conceivable that in the wavelength-converting encapsulant composition of the invention satisfying the relationship, the light emitted by the first organic material at a wavelength shifted to a longer wavelength region can be effectively and easily used to excite the second compound and then to allow the second organic material to emit light at a wavelength shifted (red-shifted) to a longer wavelength region, so that light in a wavelength region not contributable to power generation can be converted to light in a wavelength region contributable to power generation.

$\lambda_{2ex}-\lambda_{1abs} \geq 5$ (nm) Formula (2):

The wavelength-converting encapsulant composition may be characterized by satisfying the relation: $0.001 \leq C_2/C_1 \leq 0.5$, wherein $C_2/C_1$ is the ratio calculated from formula (3): $C_2/C_1 = [(P_2 \times \varepsilon_2)/Mw_2]/[(P_1 \times \varepsilon_1)/Mw_1]$, wherein $P_1$ is the number of parts by weight of the first organic material in the wavelength-converting encapsulant composition, $\varepsilon_1$ is the molar absorption coefficient of the first organic material, and $Mw_1$ is the molecular weight of the first organic material, $C_1$ is the index expressed as the product of the number $P_1$ of parts by weight, the molar absorption coefficient $\varepsilon_1$, and the reciprocal of the molecular weight $Mw_1$, $P_2$ is the number of parts by weight of the second organic material in the wavelength-converting encapsulant composition, $\varepsilon_2$ is the molar absorption coefficient of the second organic material, and $Mw_2$ is the molecular weight of the second organic material, $C_2$ is the index expressed as the product of the number $P_2$ of parts by weight, the molar absorption coefficient $\varepsilon_2$, and the reciprocal of the molecular weight $Mw_2$. The wavelength-converting encapsulant composition may satisfy $0.002 \leq C_2/C_1 \leq 0.5$, $0.003 \leq C_2/C_1 \leq 0.48$, or $0.004 \leq C_2/C_1 \leq 0.48$.

When the ratio calculated from formula (3) falls within the specified range, the mixing ratio between the first and second organic materials is preferably 0.001 to 0.5 parts by weight of the first organic material to 0.0001 to 0.1 parts by weight of the second organic material based on 100 parts by weight of the matrix resin in the wavelength-converting encapsulant composition. The mixing ratio may also be 0.001 to 0.3 parts by weight of the first organic material to 0.0001 to 0.05 parts by weight of the second organic material or 0.005 to 0.2 parts by weight of the first organic material to 0.001 to 0.02 parts by weight of the second organic material.

The molecular weights of the first and second organic materials can be determined by GC/APCI-TOF MS spectrometry or various other mass spectrometric methods (methods using an ionization technique such as ESI, APCI, or MALDI in combination with a detection technique such as a TOF, FT-ICR, or IT technique). When the organic material is a polymer or oligomer material, if necessary, the molecular weight of the organic material can be determined by performing GPC measurement (with a system using a detector such as a differential refractometer or a light scattering detector in combination) to determine its weight average molecular weight.

The combination of the first and second organic materials are preferably such that there is a large overlap between the maximum emission wavelength range of the first organic material and the maximum excitation wavelength range of the second organic material. In the case of such combination, ultraviolet light or visible light in a shorter wavelength region, which is difficult (or impossible) to use for photoelectric conversion in common solar cells, can be converted to longer wavelength light so that photoelectric conversion efficiency can be further improved. Additionally in some cases, the longer wavelength light produced as a result of the conversion by the first organic material can also be converted to longer wavelength light so that photoelectric conversion efficiency can be further improved.

The wavelength-converting encapsulant composition may also contain any appropriate known additive, as long as the desired performance is not compromised. Examples of such an additive include thermoplastic polymers, antioxidants, UV protecting agents, light stabilizers, organic peroxides, fillers, plasticizers, silane coupling agents, acid acceptors, and clay. These additives may be used alone or in a mixture of two or more.

The wavelength-converting encapsulant composition can be produced according to known methods. For example, the wavelength-converting encapsulant composition can be obtained by a process of mixing the materials by a known method using heating and kneading means, a super mixer (high-speed fluidizing mixer), a roll mill, a plasto mill, or other means. The mixing and the subsequent production of the wavelength-converting encapsulant layer may be performed continuously.

(Wavelength-Converting Encapsulant Layer)

On the other hand, the wavelength-converting encapsulant layer of the invention is characterized by being made with the wavelength-converting encapsulant composition described above.

The wavelength-converging encapsulant layer may be produced according to known methods. For example, the encapsulant layer can be appropriately produced by a process that includes mixing the materials by a known method using heating and kneading means, a super mixer (high-speed fluidizing mixer), a roll mill, a plasto mill, or other means; and forming the resulting composition into a sheet-shaped product by conventional extrusion, calender forming (calendering), vacuum heating and pressing, or other methods. Alternatively, the layer can be produced by a process that includes forming the layer on a PET film or any other film and then transferring the layer onto a surface protective layer. Alternatively, the layer can be produced using a process that includes simultaneously performing the kneading of the materials, the melting of the resulting mixture, and the application of the mixture with a hot melt applicator.

More specifically, for example, the wavelength-converting encapsulant composition itself including the matrix resin, the first and second organic materials, and any optional component may be applied to a surface protective layer, a separator, or any other material, or a mixed composition including the materials described above and other materials may be formed and then applied to a surface protective layer, a separator, or any other material. Alternatively, the wavelength-converting encapsulant composition may also be deposited by vapor deposition, sputtering, aerosol deposition, or other methods.

When the mixed composition is formed and then applied, the matrix resin preferably has a melting point of 50 to 250° C., more preferably 50 to 200° C., even more preferably 50 to 180° C., in view of processability. When the wavelength-converting encapsulant composition has a melting point of 50 to 250° C., the composition is preferably kneaded, melted, and applied at a temperature 30 to 100° C. higher than the melting point.

In some embodiments, the wavelength-converting encapsulant layer is formed as a thin film structure by the steps of: (i) dissolving a polymer (matrix resin) powder at a predetermined concentration in a solvent (such as tetrachloroethylene (TCE), cyclopentanone, or dioxane) to form a polymer solution; (ii) mixing the polymer solution and luminescent dyes (fluorescent dye compounds) with a polymer mixture in such a way that the polymer solution and the fluorescent dyes are mixed in a predetermined weight ratio, so that a dye-containing polymer solution is obtained; (iii) forming a dye-containing polymer thin film by casting the dye-containing polymer solution directly on a glass substrate, then heating the substrate from room temperature up to 100° C. over 2 hours, and completely removing the residual solvent by additional vacuum heating at 130° C. overnight; and (iv) peeling off the dye-containing polymer thin film in water and then completely drying the self-supported polymer film before use, wherein (v) the thickness of the film can be controlled by changing the concentration of the dye-containing polymer solution and the evaporation rate.

Alternatively, the composition may be processed by heating, kneading, and other steps as mentioned above. In this case, if the fluorescent dye compounds have too high a melting point, it can be difficult to uniformly disperse or dissolve the dyes in the system (such as the polymer matrix), so that it can be difficult to uniformly disperse the dyes in the resulting sheet. Therefore, the fluorescent dye compounds preferably have a melting point of 250° C. or less, more preferably 220° C. or less, even more preferably 210° C. or less. Also if the melting point is too low, a problem such as bleeding out may occur. Therefore, a melting point of 50° C. or less may be disadvantageous in the process. Therefore, the melting point is preferably 50° C. or more, more preferably 60° C. or more, even more preferably 70° C. or more. In the invention, the use of the chromophores described above makes it easy to achieve uniformity particularly in the process of forming a sheet, so that a particularly high level of productivity and processability can be achieved.

The wavelength-converting encapsulant layer preferably has a thickness of 20 to 2,000 μm, more preferably 50 to 1,000 μm, even more preferably 200 to 800 μm. If the thickness is less than 20 μm, the wavelength-converting function may be difficult to obtain. On the other hand, if the thickness is more than 2,000 μm, the wavelength-converting encapsulant layer can have lower adhesion to other layers and be disadvantageous in terms of cost.

The wavelength-converting encapsulant layer preferably has an optical thickness (absorbance) of 0.5 to 6, more preferably 1 to 4, even more preferably 1 to 3. If the absorbance is low, it can be difficult to produce the wavelength-converting function. If the absorbance is too high, the layer can also be disadvantageous in terms of cost. The absorbance is the value calculated according to the Lambert-Beer law.

(Solar Cell Module)

Figure 1:
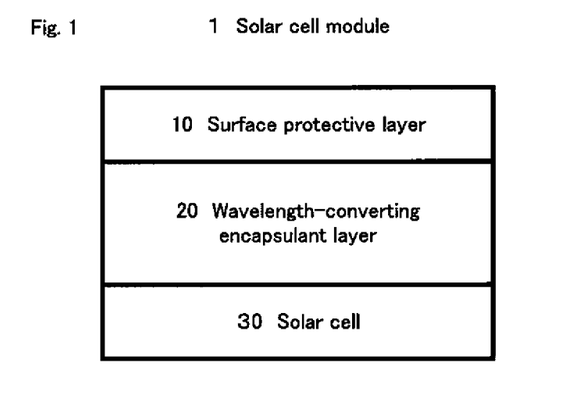
FIG. 1 is a diagram showing an example of a solar cell module using a wavelength-converting encapsulant layer according to the invention.
Figure 2:
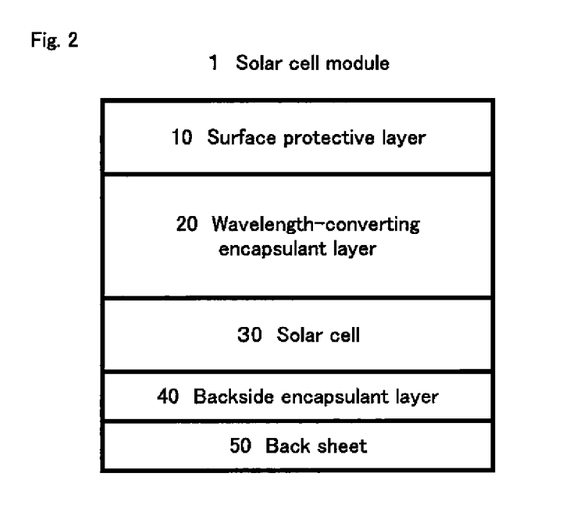
FIG. 2 is a diagram showing another example of a solar cell module using a wavelength-converting encapsulant layer according to the invention.

The solar cell module 1 of the invention includes the wavelength-converting encapsulant layer 20 and a solar cell 30. FIGS. 1 and 2 are simple schematic diagrams each showing an example of the solar cell module of the invention, which, however, are not intended to limit the invention. A surface protective layer 10, an additional encapsulant layer 40 on the backside of the solar cell, and a back sheet 50 may also be provided as needed. An additional layer such as an adhesive layer or a pressure-sensitive adhesive layer may be placed as needed between each pair of the layers as long as the function of the solar cell encapsulant layer is not impaired. If necessary, the wavelength-converting encapsulant layer of the invention may be used as the backside encapsulant layer.

In the solar cell module having the wavelength-converting encapsulant layer, a wavelength usually not contributable to the photoelectric conversion can be converted to another wavelength contributable to the photoelectric conversion. Specifically, a certain wavelength can be converted to a longer wavelength. For example, a wavelength shorter than 370 nm can be converted to a wavelength of 370 nm or more. In particular, a wavelength in the ultraviolet region (10 nm to 365 nm) can be converted to a wavelength in the visible light region (370 nm to 800 nm). The wavelength range contributing to photoelectric conversion varies with the type of solar cell, and, for example, even among silicon solar cells, it varies with the crystal morphology of the silicon used. For example, it is thought to be 400 nm to 700 nm in the case of amorphous silicon solar cells and to be about 600 nm to 1,100 nm in the case of polycrystalline silicon solar cells. Therefore, wavelengths contributing to the photoelectric conversion are not necessarily in the visible light region.

The solar cell may be, for example, a crystalline silicon solar cell, an amorphous silicon solar cell, a microcrystalline silicon solar cell, a thin-film silicon solar cell, a heterojunction solar cell, a multi-junction solar cell, a cadmium sulfide/cadmium telluride solar cell, a CIS thin-film solar cell, a CIGS thin-film solar cell, a CZTS thin-film solar cell, a group III-V solar cell, a dye-sensitized solar cell, or an organic semiconductor solar cell. The solar cell is preferably a crystalline silicon solar cell.

In the process of manufacturing the solar cell module, the solar cell encapsulant layer may be transferred onto the solar cell or formed directly on the solar cell by coating. The solar cell encapsulant layer and other layers may also be formed at the same time.

In the solar cell module of the invention, the wavelength-converting encapsulant layer is preferably so disposed that incident light passes through the wavelength-converting encapsulant layer before reaching the solar cell. In this structure, a wider spectrum of solar energy can be more reliably converted to electricity, so that the photoelectric conversion efficiency can be effectively increased.

The surface protective layer may be a known surface protective layer used in solar cell applications. The surface protective layer may be, for example, a front sheet, a glass layer, or the like. The glass layer may be any of various appropriate glass materials such as super white glass and embossed or non-embossed glass.

EXAMPLES

Hereinafter, examples and others will be described to show the features and effects of the invention specifically.

(Organic Materials)

The fluorescent compounds shown below were used in the examples and the comparative examples.

[Compound A]

[Formula]

4,7-diphenyl-2-isobutyl-2H-benzotriazole

[Compound B]

[Formula]

(1,10-phenanthroline)tris[4,4,4-trifluoro-1-(2-thienyl)-1,3-butanedionato]europium(III)

[Compound C]

[Formula]

4,7-bis(4-tert-butylphenyl)-2-isobutyl-2H-benzotriazole

[Compound D]

[Formula]

4,7-bis(4-isobutyloxyphenyl)-2-isobutyl-2H-benzotriazole

[Compound E]

[Formula]

4,7-bis(4-tert-butylphenyl)-2,1,3-benzothiadiazole

[Compound F]

[Formula]

4,7-bis(4-isobutyloxyphenyl)-2,1,3-benzothiadiazole (Other Compounds)
Matrix resin: SUMITATE KA30 (ethylene vinyl acetate (EVA) resin, manufactured by Sumitomo Chemical Company, Limited)
Peroxide: PERBUTYL E (tert-butylperoxy-2-ethylhexyl monocarbonate, manufactured by NOF CORPORATION)
Crosslinking aid: TAIC (triallyl isocyanurate, manufactured by Nippon Kasei Chemical Company Limited)
Antioxidant: BHT (dibutylhydroxytoluene, manufactured by Tokyo Chemical Industry Co., Ltd.)
Light stabilizer: Tinuvin 144 (bis(1,2,2,6,6-pentamethyl-4-piperidyl)[[3,5-bis(1,1-dimeth ylethyl)-4-hydroxyphenyl]methyl]butyl malonate, manufactured by BASF)
Silane coupling agent: KBM 503 (3-methacryloxypropyltrimethoxysilane, manufactured by Shin-Etsu Chemical Co., Ltd.)

(Measurement of Molecular Weight)
The molecular weights of the luminescent compounds were evaluated by GC/APCI-TOF MS spectrometry.

(Encapsulant)
In each of the examples and the comparative examples, each encapsulant layer (encapsulating sheet) was produced by the method described below in which the respective compounds were mixed according to the formulation shown in the tables.

[Resin Composition for Encapsulating Sheet]
In each of the examples and the comparative examples, 100 parts by weight of the EVA resin and the respective compounds were weighed and dry-blended. The blend was then melted and kneaded using a single screw extruder to form pellets of an ethylene copolymer composition. Using a press forming machine, a encapsulant layer resin sheet (about 650 µm in thickness) was formed from the pellets.

(Measurement of Maximum Absorption Wavelength)
The maximum absorption wavelength was measured with an ultraviolet-visible spectrophotometer (V-560 manufactured by JASCO Corporation, wavelength range 300 to 800 nm). The maximum absorption wavelength was defined as the wavelength at which the absorption spectrum showed the maximum absorbance.

(Maximum Excitation Wavelength and Maximum Emission Wavelength)
The maximum excitation wavelength and the maximum emission wavelength were measured with a fluorescence spectrophotometer (F-4500 manufactured by Hitachi High-Technologies Corporation). The maximum emission wavelength was defined as the wavelength at which the emission intensity was maximum in the three-dimensional excitation-emission matrix spectroscopy. The maximum excitation wavelength was defined as the wavelength at which the maximum emission wavelength excitation spectrum showed the maximum emission intensity.

(Measurement of Emission Quantum Yield)
The emission quantum yield was measured with a multi-channel photo detector (MCPD) (MCPD-9800 manufactured by Otsuka Electronics Co., Ltd., QE1100L, Software Ver. 1.10.10.1). The emission quantum yield was measured for the excitation at the maximum excitation wavelength.

(Measurement of Jsc of Solar Cell Module)
A 20 cm×20 cm piece was cut from the resulting encapsulating sheet. A toughened glass sheet (Solite manufactured by Asahi Glass Co., Ltd.) as a protective glass sheet, the cut piece of the encapsulating sheet, a solar cell (Q6LTT3-G2-200/1700-A (crystalline silicon type) manufactured by Hanwha Q Cells GmbH), a backside encapsulating sheet (a 400-μm-thick EVA sheet), and a PET film as a back sheet were stacked together. The stack was subjected to a lamination process using a vacuum laminator (LM-50×50-S manufactured by NPC Incorporated) under the conditions of 140° C., 5-minute vacuuming, and 10-minute pressurization, so that a solar cell module was obtained. The spectral response of the resulting solar cell module was measured with a spectral response measurement system (CEP-25RR manufactured by Bunkoukeiki Co., Ltd.). The Jsc value was calculated from the spectral response measurements. As used herein, the term "Jsc value" refers to the short-circuit current density calculated from standard solar radiation data and spectral response spectrum data obtained from the measurement of the sample with the spectral response measurement system.

Figure 3:
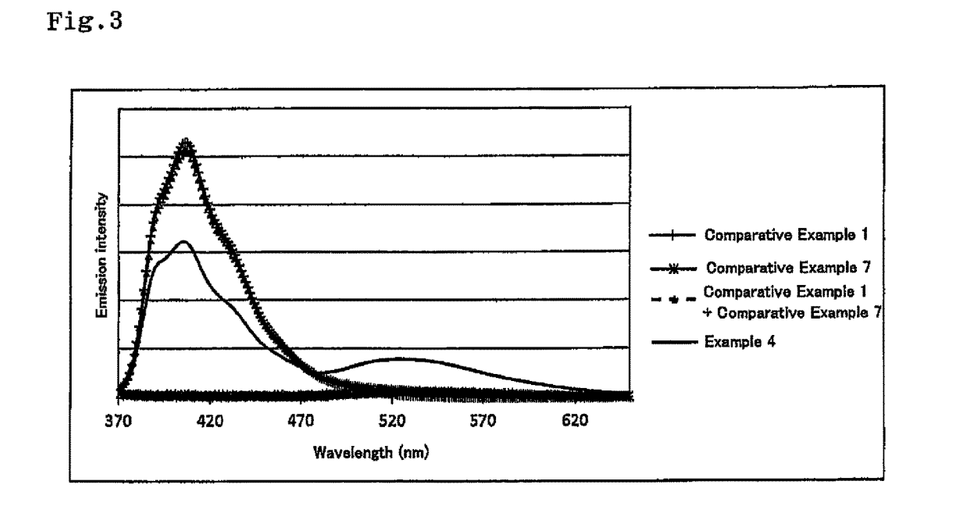
FIG. 3 is a graph showing the results of fluorescence spectroscopy in an example according to the invention.
Figure 4:
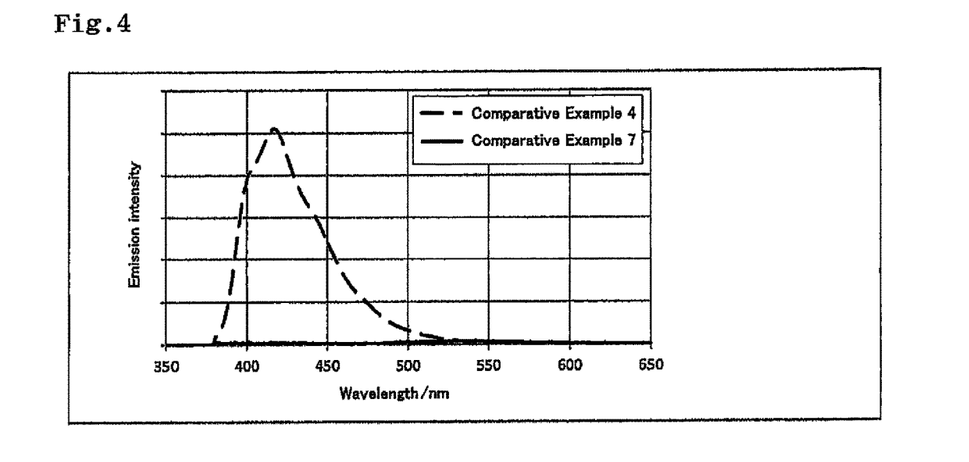
FIG. 4 is a graph showing the results of fluorescence spectroscopy in an example according to the invention.
Figure 5:
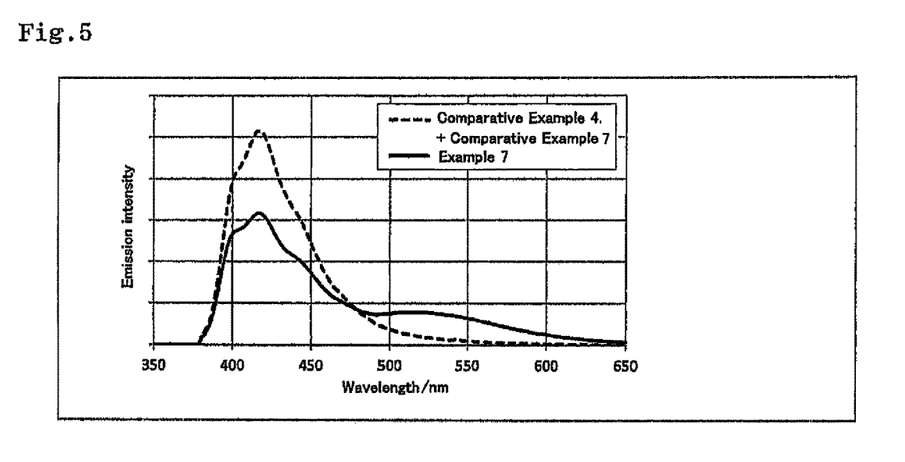
FIG. 5 is a graph showing the results of fluorescence spectroscopy in an example according to the invention.
Figure 6:
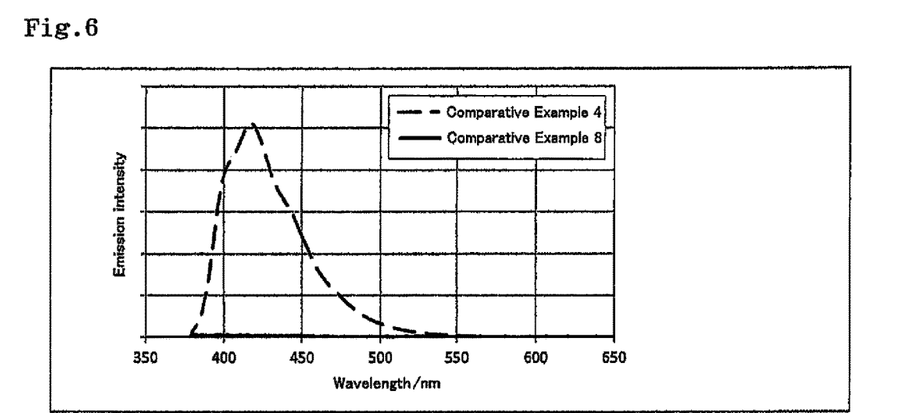
FIG. 6 is a graph showing the results of fluorescence spectroscopy in an example according to the invention.
Figure 7:
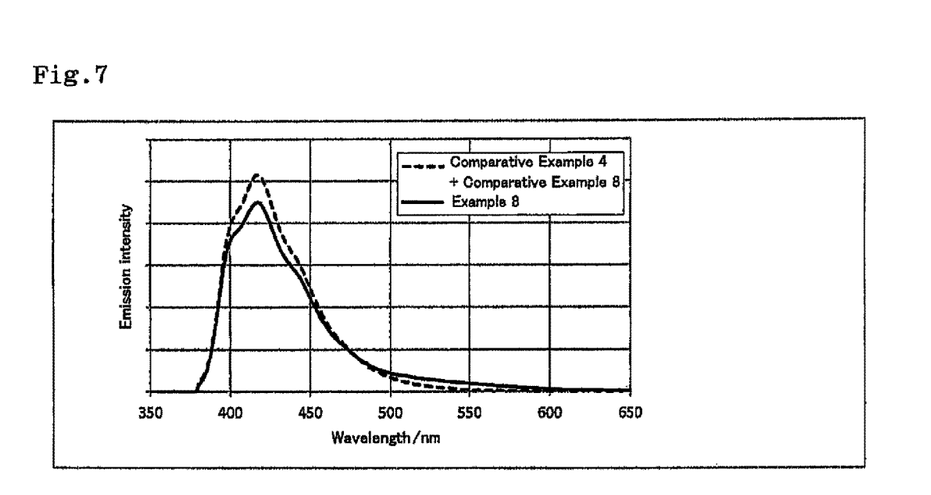
FIG. 7 is a graph showing the results of fluorescence spectroscopy in an example according to the invention.
Figure 8:
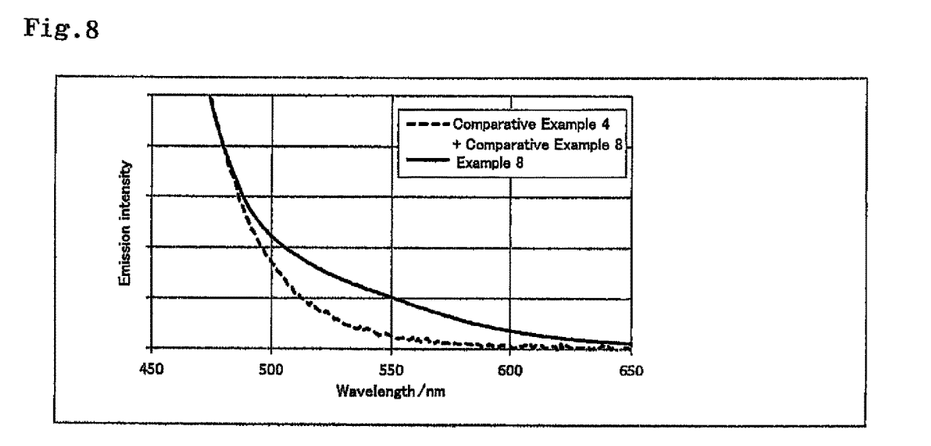
FIG. 8 is a graph showing the results of fluorescence spectroscopy in an example according to the invention.

Tables 1 to 3 below and FIG. 3 show the results of the measurement performed on each sample using each resulting encapsulant layer (encapsulating sheet). The term "output" refers to the rate of increase or decrease in Jsc value, which is calculated as the ratio of the Jsc value in each of the examples and the comparative examples to the Jsc value obtained when only the EVA resin was used.

TABLE 1

| Organic material | Molecular weight | Maximum absorption wavelength | Molar absorption coefficient | Maximum excitation wavelength | Maximum emission wavelength | Emission quantum yield |
| --- | --- | --- | --- | --- | --- | --- |
| Compound A | 327.42 | 340 nm | 23000 (340 nm) | 330 nm | 400 nm | 99% |
| Compound B | 995.69 | 340 nm | 17000 (340 nm) | 340 nm | 610 nm | 62% |
| Compound C | 439.64 | 345 nm | 25000 (345 nm) | 345 nm | 415 nm | 97% |
| Compound D | 471.63 | 360 nm | 28000 (360 nm) | 350 nm | 435 nm | 96% |
| Compound E | 400.58 | 395 nm | 10000 (395 nm) | 400 nm | 490 nm | 97% |
| Compound F | 432.58 | 420 nm | 12000 (420 nm) | 430 nm | 520 nm | 93% |

TABLE 2

|  | Example 1 | Example 2 | Example 3 | Example 4 | Example 5 | Example 6 | Example 7 | Example 8 |
| --- | --- | --- | --- | --- | --- | --- | --- | --- |
| Matrix resin | 100 | 100 | 100 | 100 | 100 | 100 | 100 | 100 |
| Compound A | 0.1 | 0.1 | 0.1 | 0.1 |  |  |  |  |
| Compound B |  |  |  |  |  |  |  |  |
| Compound C | 0.025 |  |  |  | 0.025 | 0.025 | 0.1 | 0.1 |
| Compound D |  | 0.01 |  |  |  |  |  |  |
| Compound E |  |  | 0.005 |  | 0.005 |  |  |  |
| Compound F |  |  |  | 0.005 |  | 0.005 | 0.005 | 0.001 |
| Peroxide | 0.3 | 0.3 | 0.3 | 0.3 | 0.3 | 0.3 | 0.3 | 0.3 |
| Crosslinking aid | 1 | 1 | 1 | 1 | 1 | 1 | 1 | 1 |
| Antioxidant | 0.06 | 0.06 | 0.06 | 0.06 | 0.06 | 0.06 | 0.06 | 0.06 |
| Light stabilizer | 0.01 | 0.01 | 0.01 | 0.01 | 0.01 | 0.01 | 0.01 | 0.01 |
| Silane coupling agent | 0.2 | 0.2 | 0.2 | 0.2 | 0.2 | 0.2 | 0.2 | 0.2 |
| Output (Ratio to pure EVA) | 0.25% | 0.28% | 0.27% | 0.20% | 0.28% | 0.21% | 0.25% | 0.28% |

Component amounts are in units of parts by weight.

TABLE 3

|  | Comparative Example 1 | Comparative Example 2 | Comparative Example 3 | Comparative Example 4 | Comparative Example 5 | Comparative Example 6 | Comparative Example 7 | Comparative Example 8 | Comparative Example 9 | Comparative Example 10 |
| --- | --- | --- | --- | --- | --- | --- | --- | --- | --- | --- |
| Matrix resin | 100 | 100 | 100 | 100 | 100 | 100 | 100 | 100 | 100 | 100 |
| Compound A | 0.1 |  |  |  |  |  |  |  |  |  |
| Compound B |  | 0.007 |  |  |  |  |  |  | 0.007 | 0.007 |
| Compound C |  |  | 0.025 | 0.1 |  |  |  |  |  |  |
| Compound D |  |  |  |  | 0.01 |  |  |  |  |  |
| Compound E |  |  |  |  |  | 0.005 |  |  | 0.005 |  |
| Compound F |  |  |  |  |  |  | 0.005 | 0.001 |  | 0.005 |
| Peroxide | 0.3 | 0.3 | 0.3 | 0.3 | 0.3 | 0.3 | 0.3 | 0.3 | 0.3 | 0.3 |
| Crosslinking aid | 1 | 1 | 1 | 1 | 1 | 1 | 1 | 1 | 1 | 1 |
| Antioxidant | 0.06 | 0.06 | 0.06 | 0.06 | 0.06 | 0.06 | 0.06 | 0.06 | 0.06 | 0.06 |
| Light stabilizer | 0.01 | 0.01 | 0.01 | 0.01 | 0.01 | 0.01 | 0.01 | 0.01 | 0.01 | 0.01 |
| Silane coupling agent | 0.2 | 0.2 | 0.2 | 0.2 | 0.2 | 0.2 | 0.2 | 0.2 | 0.2 | 0.2 |
| Output (Ratio to pure EVA) | 0.11% | 0.16% | 0.14% | 0.20% | 0.17% | 0.14% | 0.02% | 0.01% | 0.06% | 0.06% |

Component amounts are in units of parts by weight.

The results of the measurement in the tables and the drawings show that a good improvement in the photoelectric conversion efficiency was observed in the examples where formula (1) is satisfied in the range according to the invention. In contrast to the examples, no improvement in the photoelectric conversion efficiency or no significant synergistic improvement effect was observed in the comparative examples where formula (1) is not satisfied in the range according to the invention.

DESCRIPTION OF REFERENCE SIGNS

In the drawings, reference sign 1 represents a solar cell module, 10 a surface protective layer, 20 a wavelength-converting encapsulant layer, 30 a solar cell, 40 a backside encapsulant layer, and 50 a back sheet.

The invention claimed is:

1. A wavelength-converting encapsulant composition, comprising:
   a first organic material capable of absorbing ultraviolet light and converting absorbed light to light with a wavelength longer than that of the absorbed light; and
   a second organic material capable of absorbing light with a wavelength longer than that of the light absorbed by the first organic material and converting absorbed light to light with a wavelength longer than that of the absorbed light,
   wherein:
   the first organic material has a maximum absorption wavelength $\lambda_{1abs}$ and a maximum emission wavelength $\lambda_{1em}$;
   the second organic material has a maximum excitation wavelength $\lambda_{2ex}$ of 450 nm or less;
   the maximum emission wavelength $\lambda_{1em}$ of the first organic material and the maximum excitation wavelength $\lambda_{2ex}$ of the second organic material satisfy the relationship of formula (1): $\lambda_{1em} - 60 \leq \lambda_{2ex}$ (nm);
   the maximum absorption wavelength $\lambda_{1abs}$ of the first organic material and the maximum excitation wavelength $\lambda_{2ex}$ of the second organic material satisfy the relationship of formula (2): $\lambda_{2ex} - \lambda_{1abs} \geq 5$ (nm); and
   the first organic material has an emission quantum yield $\phi_1$ of 85% or more.

2. The wavelength-converting encapsulant composition according to claim 1, wherein the first organic material has a Stokes shift $\Delta\lambda_1$ of 50 nm or more.

3. The wavelength-converting encapsulant composition according to claim 1, wherein the second organic material has an emission quantum yield $\phi_2$ of 85% or more.

4. The wavelength-converting encapsulant composition according to claim 1, wherein the first organic material comprises at least one selected from the group consisting of a perylene derivative, a benzoxazole derivative, a benzothiadiazole derivative, a benzotriazole derivative, and a fluorene derivative.

5. The wavelength-converting encapsulant composition according to claim 1, wherein the second organic material comprises at least one selected from the group consisting of a perylene derivative, a benzoxazole derivative, a benzothiadiazole derivative, a benzotriazole derivative, and a fluorene derivative.

6. The wavelength-converting encapsulant composition according to claim 1, which is for use in solar cell applications.

7. A wavelength-converting encapsulant layer comprising a product made from the wavelength-converting encapsulant composition according to claim 1.

8. A solar cell module comprising the wavelength-converting encapsulant layer according to claim 7 and a solar cell.

9. The solar cell module according to claim 8, wherein the solar cell is a crystalline silicon solar cell, an amorphous silicon solar cell, a microcrystalline silicon solar cell, a thin-film silicon solar cell, a heterojunction solar cell, a multi-junction solar cell, a cadmium sulfide/cadmium telluride solar cell, a CIS thin-film solar cell, a CIGS thin-film solar cell, a CZTS thin-film solar cell, a group III-V solar cell, a dye-sensitized solar cell, or an organic semiconductor solar cell.

* * * * *